(12) United States Patent
Bhalla et al.

(10) Patent No.: US 8,354,316 B2
(45) Date of Patent: Jan. 15, 2013

(54) REDUCED MASK CONFIGURATION FOR POWER MOSFETS WITH ELECTROSTATIC DISCHARGE (ESD) CIRCUIT PROTECTION

(76) Inventors: Anup Bhalla, Santa Clara, CA (US); Xiaobin Wang, San Jose, CA (US); Wei Wang, Santa Clara, CA (US); Yi Su, Sunnyvale, CA (US); Daniel Ng, Campbell, CA (US)

( * ) Notice: Subject to any disclaimer, the term of this patent is extended or adjusted under 35 U.S.C. 154(b) by 0 days.

(21) Appl. No.: 12/925,820

(22) Filed: Oct. 29, 2010

(65) Prior Publication Data

US 2011/0076815 A1    Mar. 31, 2011

Related U.S. Application Data

(62) Division of application No. 12/006,398, filed on Dec. 31, 2007, now Pat. No. 7,825,431.

(51) Int. Cl.
*H01L 21/8234* (2006.01)
(52) U.S. Cl. .. 438/237; 438/328; 438/983; 257/E21.619
(58) Field of Classification Search .................. 438/237, 438/328, 983
See application file for complete search history.

(56) References Cited

U.S. PATENT DOCUMENTS

| 2003/0052367 A1* | 3/2003 | Lin | 257/355 |
|---|---|---|---|
| 2006/0071276 A1* | 4/2006 | Zundel et al. | 257/355 |
| 2007/0176239 A1* | 8/2007 | Hshieh | 257/355 |

* cited by examiner

*Primary Examiner* — Thanh Nguyen
(74) *Attorney, Agent, or Firm* — Bo-In Lin

(57) ABSTRACT

A semiconductor power device supported on a semiconductor substrate includes an electrostatic discharge (ESD) protection circuit disposed on a first portion of patterned ESD polysilicon layer on top of the semiconductor substrate. The semiconductor power device further includes a second portion of the patterned ESD polysilicon layer constituting a body implant ion block layer for blocking implanting body ions to enter into the semiconductor substrate below the body implant ion block layer. In an exemplary embodiment, the electrostatic discharge (ESD) polysilicon layer on top of the semiconductor substrate further covering a scribe line on an edge of the semiconductor device whereby a passivation layer is no longer required manufacturing the semiconductor device for reducing a mask required for patterning the passivation layer.

10 Claims, 10 Drawing Sheets

US 8,354,316 B2

REDUCED MASK CONFIGURATION FOR POWER MOSFETS WITH ELECTROSTATIC DISCHARGE (ESD) CIRCUIT PROTECTION

This Patent Application is a Divisional Application and claims the Priority Date of a application Ser. No. 12/006,398 filed on Dec. 31, 2007 now U.S. Pat. No. 7,805,431, by common Inventors of this Application. The Disclosures made in the patent application Ser. No. 12/006,398 are hereby incorporated by reference.

BACKGROUND OF THE INVENTION

1. Field of the Invention

The invention relates generally to the configuration and manufacturing process of the semiconductor power devices. More particularly, this invention relates to an improved configuration for manufacturing an electrostatic discharge (ESD) protection circuit integrated with a semiconductor power device with reduced number of masks such that the semiconductor power device can be manufactured with simplified process, lower costs, improved production yield, and higher performance reliability.

2. Description of the Prior Art

Conventional layout for manufacturing semiconductor power devices with protection circuits against electrostatic discharges (ESD) still has a limitation. The conventional power MOSFET devices with ESD protection circuit generally have a layout and layer structures that requires application of seven masks in the typical manufacturing processes. These seven masks include a trench mask, an ESD mask, a body mask, a source mask, a contact mask, a metal mask and a passivation mask. With the seven masks required in the manufacturing processes, the processing steps are more complicated and time consuming. Additional manufacturing with more mask requirements further generates the likelihood of processing abnormalities and product defects thus degrade the performance. Finally but not least, the production costs are significantly increased not only due to the more complicated processes and manufacturing time required, but also due to the lower yields as the result of requiring more masks when the semiconductor power device is implemented with the conventional layout and layer structures.

Referring to FIGS. 1A and 1B for a cross sectional view and a top view of a conventional semiconductor power device such as a MOSFET device provided with ESD protection circuit. More specifically, the manufacturing processes and the layout with conventional layer structures as shown require a body mask to form the guard rings in the termination area. Furthermore, a passivation mask is required to open contact windows through the passivation layer for package connection, where the passivation layer is required to cover the die edge and scribe line.

Therefore, it is necessary to provide alternate layout for the ESD circuits on the semiconductor power device not limited by the conventional layout and layer structures without affecting the ESD protection ratings. It is also desirable that the new layout can reduce the mask requirements thus simplify the processing steps to achieve cost savings, improved yield and better performance and lifetime reliability of the semiconductor power devices.

SUMMARY OF THE PRESENT INVENTION

It is therefore an aspect of the present invention to provide a new and improved layout of an ESD protection circuit on a semiconductor power device by forming the ESD protection circuits in the termination area with guard ring surrounding the ESD structure to improve the semiconductor power device breakdown. It is further another aspect of the present invention to provide a new and improved layout of an ESD protection circuit on a semiconductor power device by forming the ESD protection circuits in the termination area with a different layout and layer structure by applying an ESD polysilicon layer to function also as a body block mask to achieve a simplified manufacturing process by removing a body mask requirement. By removing the requirement of using a body block mask, the manufacturing processes are simplified and the production cost is decreased while the production yield is improved. The above discussed problems and limitations of the conventional technologies are therefore resolved.

It is another aspect of this invention that in an exemplary embodiment, the ESD polysilicon layer covers both the scribe lines and the die edges such that the requirement of a passivation mask is eliminated. The outer termination polysilicon is connected to the epitaxial layer of substrate in the corner of the device functioning as a filed plate to prevent early termination breakdown that would occur if the polysilicon layer were operating in a floating voltage thus enabling the device to operate in a higher voltage range. The potential limitation of the device to operate in the low voltage due to a floating polysilicon segment in the termination area is therefore resolved.

It is another aspect of this invention that in an exemplary embodiment, the outer termination polysilicon functioning as body block is patterned into a plurality of diodes connecting back to back in series between the epitaxial layer of substrate and the source metal of the device whereby the polysilicon body block is also functioning as a field plate with grade bias across the back to back diodes for further preventing early termination breakdown.

Briefly in a preferred embodiment this invention discloses a semiconductor power device supported on a semiconductor substrate. The semiconductor power device includes an electrostatic discharge (ESD) protection circuit disposed on a first portion of a patterned ESD polysilicon layer on top of the semiconductor substrate. The semiconductor power device further includes a second portion of the patterned ESD polysilicon layer constituting a body implant ion block layer for blocking implanting body ions from entering into the semiconductor substrate therefore reduce a mask for body implant. In an exemplary embodiment, the second portion of electrostatic discharge (ESD) polysilicon layer on top of the semiconductor substrate further covering a scribe line on an edge of the semiconductor device whereby a passivation layer is no longer required for the semiconductor device therefore reducing a mask required for patterning the passivation layer. In another exemplary embodiment, the semiconductor power device further includes a metal contact dispose on a corner of the semiconductor device for electrically connecting the second portion of the ESD polysilicon layer constituting the body implant-ion block to a drain voltage whereby the body implant-ion block is operated in a non-floating voltage in the semiconductor power device. In an exemplary embodiment, the second portion of electrostatic discharge (ESD) polysilicon layer on top of the semiconductor substrate is further patterned into a plurality of diodes connecting back to back in series between source and epitaxial layer of substrate for improving termination breakdown voltage. In another exemplary embodiment, the semiconductor power device further comprising an active cell area and a termination area wherein the ESD protection circuit in the first portion of the ESD polysilicon layer disposed in the termination area opposite the active cell area of the semiconductor power device. In another exemplary embodiment, the ESD protection circuit in the first portion of the ESD polysilicon layer further includes diodes with the first portion of the ESD polysilicon layer doped with alternating P-type and N-type region. The semiconductor power device further includes a MOSFET device comprising body regions formed with an blanket body implant and source regions encompassed in the body regions, wherein the source regions are simultaneously formed with the ESD protection circuit by applying a source mask. In another exemplary embodiment, the semiconductor power device of further includes a MOSFET device and the ESD protection circuit further electrically connected to a gate and a source of the MOSFET device. In another exemplary embodiment, the semiconductor power device further includes a guard ring surrounding the ESD protection circuit for the semiconductor power device. In another exemplary embodiment, the ESD protection circuit further includes a resistor segment in the first portion of the ESD polysilicon layer.

A method for manufacturing a semiconductor power device on a semiconductor substrate is also disclosed. The method includes a step of depositing an electrostatic discharge (ESD) polysilicon layer on top of the semiconductor substrate and patterning the ESD polysilicon layer into a first portion and a second portion. The method further includes a step of forming an ESD protection circuit in the first portion of the ESD polysilicon layer and applying the second portion of the ESD polysilicon layer as a body implant-ion block whereby a body implant mask is no longer required in the method of manufacturing the semiconductor power device. In an exemplary embodiment, the step of depositing the electrostatic discharge (ESD) polysilicon layer on top of the semiconductor substrate further comprising depositing the ESD polysilicon layer for covering a scribe line on an edge of the semiconductor device whereby a passivation layer is no longer required in the method of manufacturing the semiconductor device for reducing a mask for patterning the passivation layer. In another exemplary embodiment, the method further includes a step of forming a metal contact on a corner of the semiconductor device for electrically connecting the second portion of the ESD polysilicon layer constituting the body implant-ion block to a drain voltage whereby the body implant-ion block is operated in a non-floating voltage in the semiconductor power device. In another exemplary embodiment, the method of forming the second portion of the ESD polysilicon layer constituting the body implant-ion block further comprising a step of patterning the second portion of the ESD polysilicon layer into a plurality of alternating P-type and N-type polysilicon sections forming back to back diodes in series connected between a source and a epitaxial layer of substrate of the semiconductor power device. In another exemplary embodiment, the step of forming the ESD protection circuit in the first portion of the ESD polysilicon layer further comprising forming the ESD protection circuit in a termination area opposite an active cell area of the semiconductor power device. In another exemplary embodiment, the step of forming the ESD protection circuit in the first portion of the ESD polysilicon layer further comprising a step applying a body dopant implant with a blanket body ion implantation followed by applying a source mask covering a portion of the first portion of the ESD polysilicon layer and the body implant-ion block for doping the first portion of ESD polysilicon layer into ESD diodes formed with alternating P-type and N-type polysilicon sections in the first portion of the ESD polysilicon layer. In another exemplary embodiment, the step of forming the ESD protection circuit for the semiconductor power device further comprising a step of forming the ESD protection circuit for a MOSFET device with the ESD protection circuit electrically connected to a source and a gate of the MOSFET device. In another exemplary embodiment, the method further includes a step of forming a guard ring surrounding the ESD protection circuit for the semiconductor power device. In another exemplary embodiment, the step of forming the ESD protection circuit further comprises a step of forming a resistor segment in the first portion of the ESD polysilicon layer. In another exemplary embodiment, the method further includes a step of applying a trench mask for opening a plurality of trenches before the step of depositing and patterning the electrostatic discharge (ESD) polysilicon layer on top of the semiconductor substrate. After the step of depositing and patterning the ESD polysilicon layer, the method further includes a step of applying a source mask for covering a portion of the first portion of the ESD polysilicon layer and the body implant-ion block for doping the first portion of ESD polysilicon layer into ESD diodes formed with alternating P-type and N-type polysilicon sections in the first portion of the ESD polysilicon layer and implanting a plurality of source regions in the body regions. The method further includes a step of applying a contact mask, a metal mask and a passivation mask for manufacturing the semiconductor power device whereby a manufacturing process by applying six masks is achieved. In another exemplary embodiment, the method further includes a step of applying a trench mask for opening a plurality of trenches before the step of depositing and patterning the electrostatic discharge (ESD) polysilicon layer on top of the semiconductor substrate. The step of depositing and patterning the ESD polysilicon layer further includes a step of depositing and patterning the ESD polysilicon layer for covering scribe lines on edges of the semiconductor power device. After the step of depositing and patterning the ESD polysilicon layer, the method further includes steps of applying a source mask; a contact mask, and a metal mask for manufacturing the semiconductor power device whereby a manufacturing process by applying five masks is achieved.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
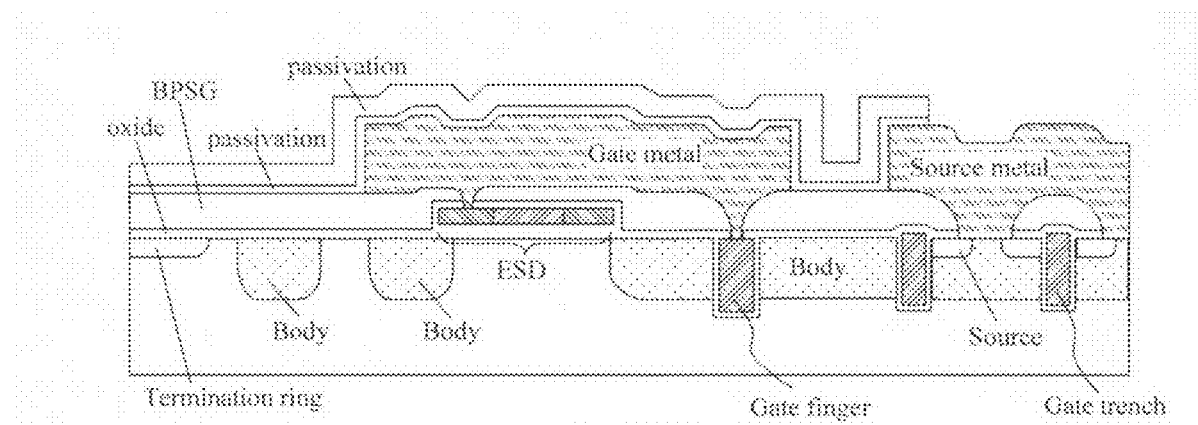
FIGS. 1A to 1B are cross sectional view and top view of a conventional MOSFET device with the termination area provided with ESD protection circuit.
Figure 1B:
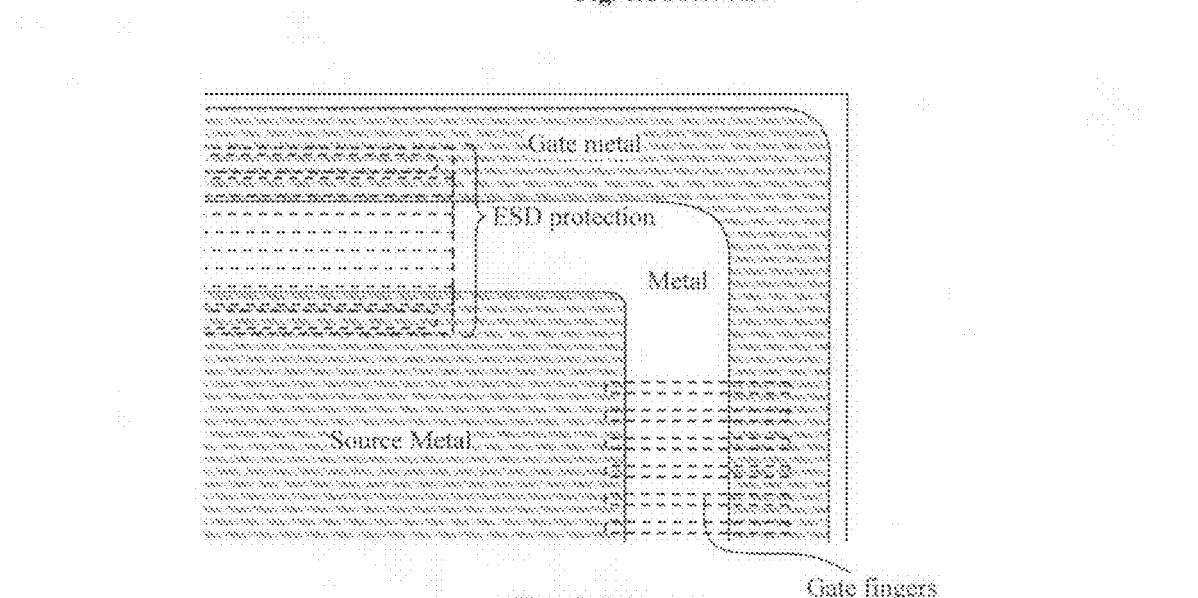
Figure 2:
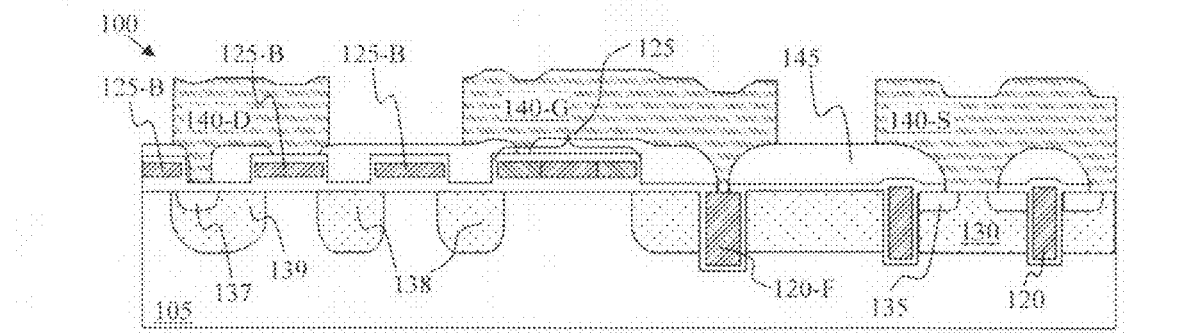
FIG. 2 is a cross sectional view of a MOSFET device protected by an ESD protection circuit manufactured by a process with reduce mask requirement by applying ESD polysilicon segments as body implant block layer.

For simplicity only trench MOSFET device is illustrated. This invention applies to other types of trench power devices as well as planar power devices. Refer to FIG. 2 for a metal oxide semiconductor field effect transistor (MOSFET) device 100 of this invention. FIG. 2 shows a cross sectional view of the termination area and a portion of active area of the MOSFET device 100 that is supported on a semiconductor substrate 105 formed with trenched gates 120 surrounded by body regions 130 encompassing source region 135 therein. The MOSFET device 100 is covered by an oxide insulation layer 145 having gate contact opening for the gate metal 140-G to contact the trenched gate 120 through gate finger 120-F. The MOSFET device 100 is protected by ESD diodes 125 that typically formed on a polysilicon layer deposited on top of the substrate 100. In order to eliminate the requirement of a body block mask, there are polysilicon segments 125-B formed on top of the substrate 100 to function as body blocks when carrying out the body implantation. One or more guard rings 138 doped with body type dopant may be formed during body implant through the gaps between polysilicon sections. As will be further described below, the body block polysilicon segments 125-B are often referred as ESD body block as they are typically formed together with the ESD polysilicon layer 125 and etched by applying a special patterned ESD mask. The body block polysilicon segments 125-B may be floating or tie to the drain directly. As shown in FIG. 2, the body block polysilicon segments 125-B may be tied to drain voltage through a source-doping region 137 and a body-doping region 139 where the high source-doping region is off center to counter dope the body dope region at the edge for establishing the connection to drain.

Figure 3A:
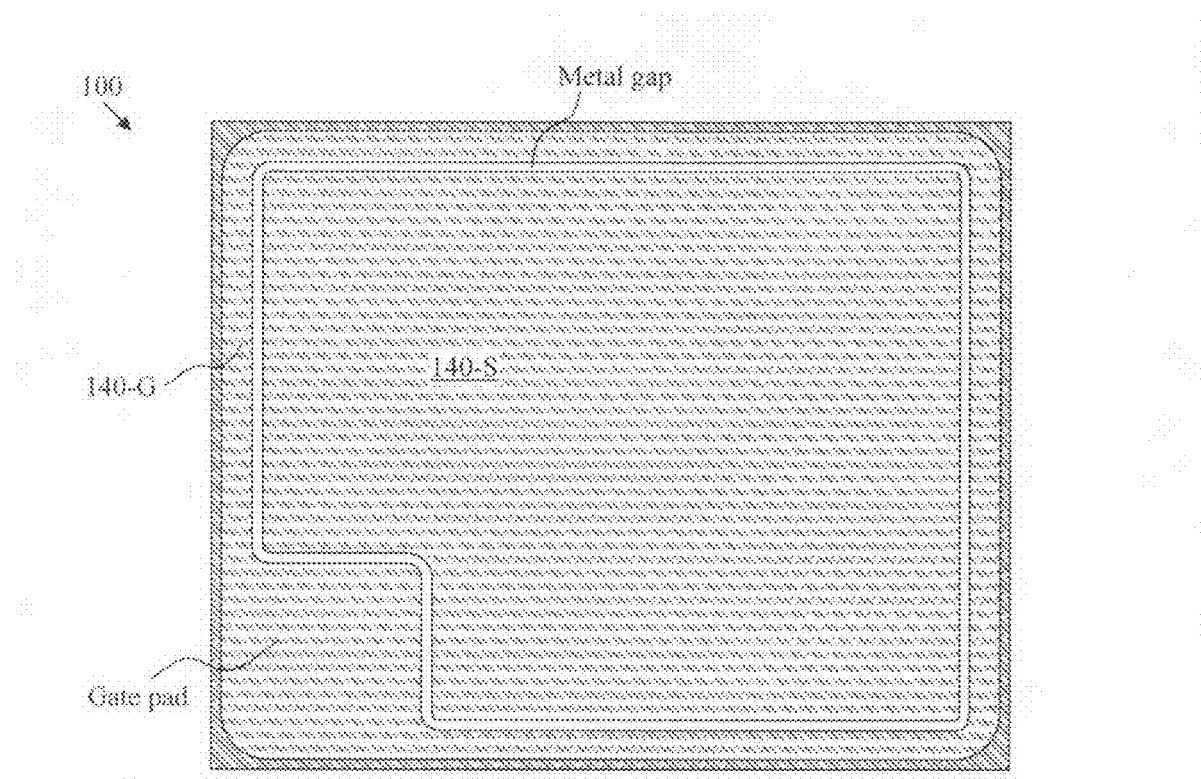
FIGS. 3A, 3B and 3C are a three top views for showing an overall top view and two explosive top view of a corner of a MOSFET device of this invention manufactured with reduced number of masks by applying an ESD polysilicon layer as a body ion implant blocking mask.
Figure 3B:
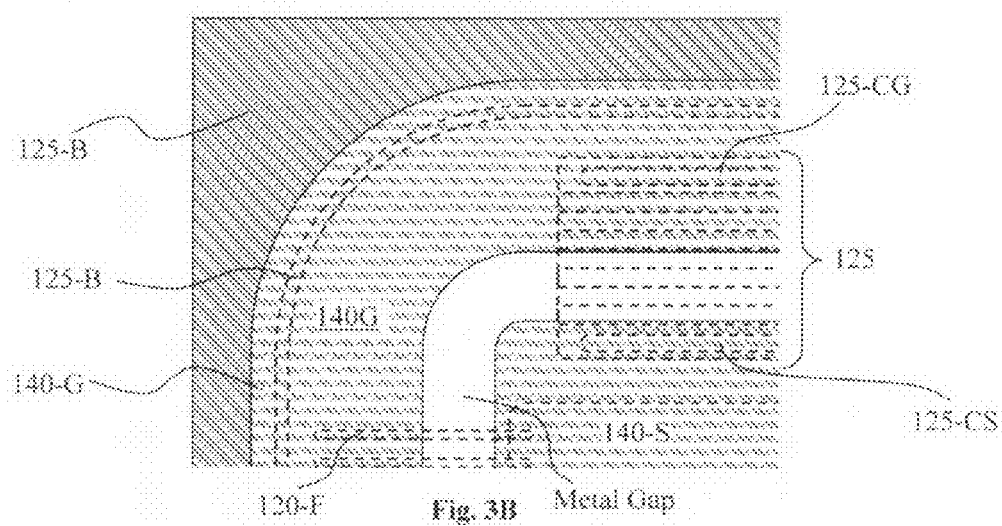
Figure 3C:
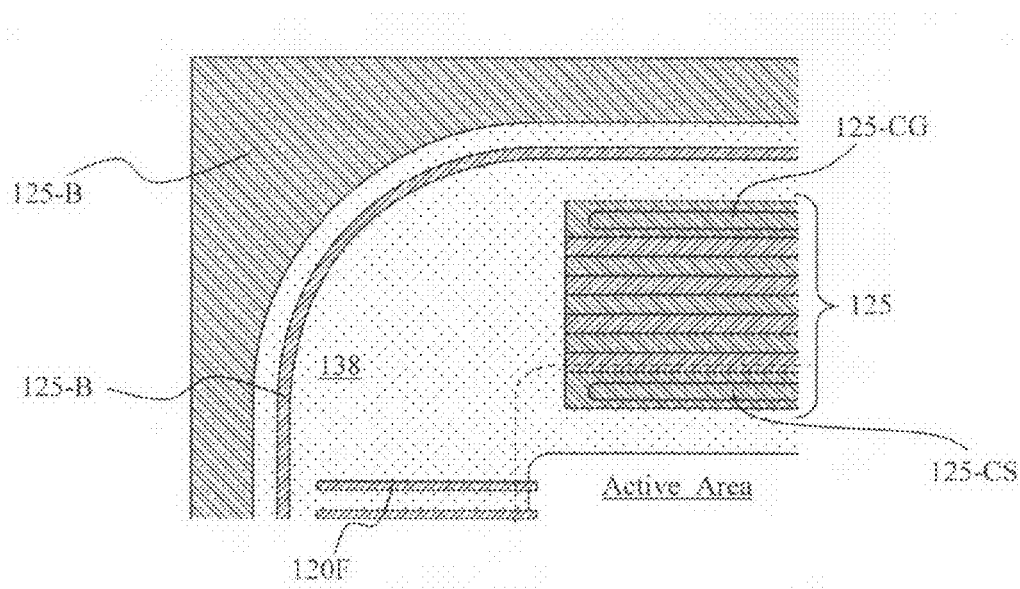

Referring to FIGS. 3A to 3C for three top views that include an overall top view and two explosive top views for the corners to show the layout of the device. As shown in FIG. 3A, the gate metal is formed around the device connecting with gate trench fingers 120-F extended from the trenched gate in the active cell area to the termination area. Alternatively a trenched gate runner may be formed around the device connecting to trench gate fingers (not shown). On the left upper corner where the details can be seen in FIG. 3B, the ESD protection circuit 125 is connected to the gate metal 140 through the ESD-gate contact 125-CG and connected to the source metal 140-S through the ESD-source contact 125-CS. The ESD body block 125-B may be extended to the edge of the device. FIG. 3C is same as FIG. 3B with the gate metal 140-G and source metal 140-S removed to show the layer structure underneath. As shown the ESD body block may be patterned to have one or more narrow bands to form guard rings 138 in FIG. 2.

Figure 4A:
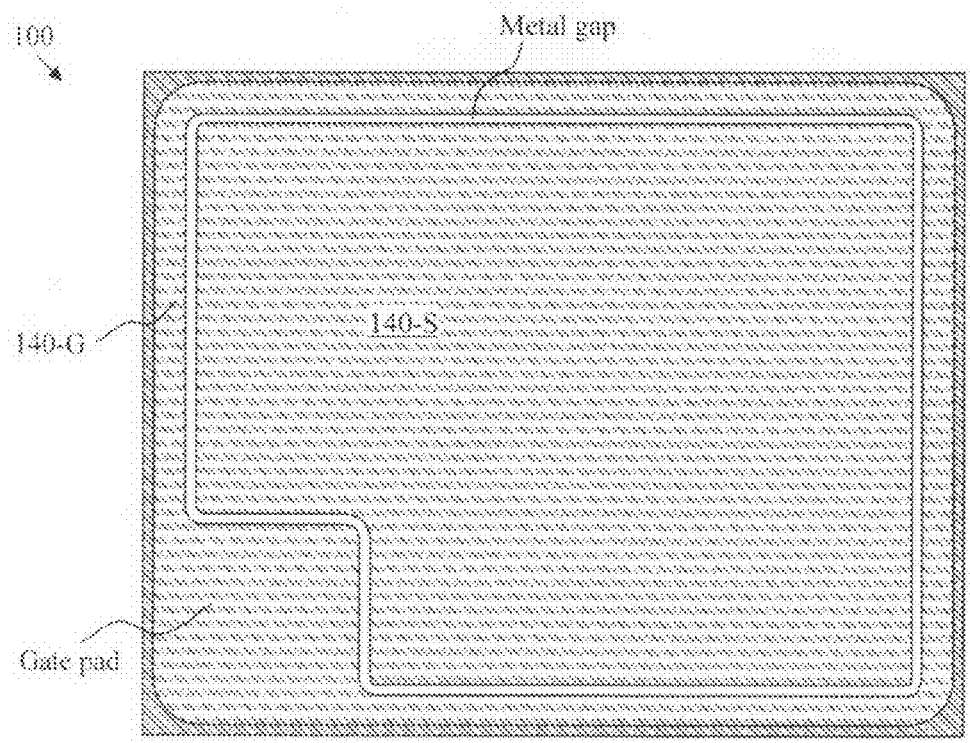
FIGS. 4A, 4B and 4C are a three top views for showing an overall top view and two explosive top view of a corner of a MOSFET device as an alternate embodiment of this invention manufactured with reduced number of masks by applying an ESD polysilicon layer as a body ion implant blocking mask.
Figure 4B:
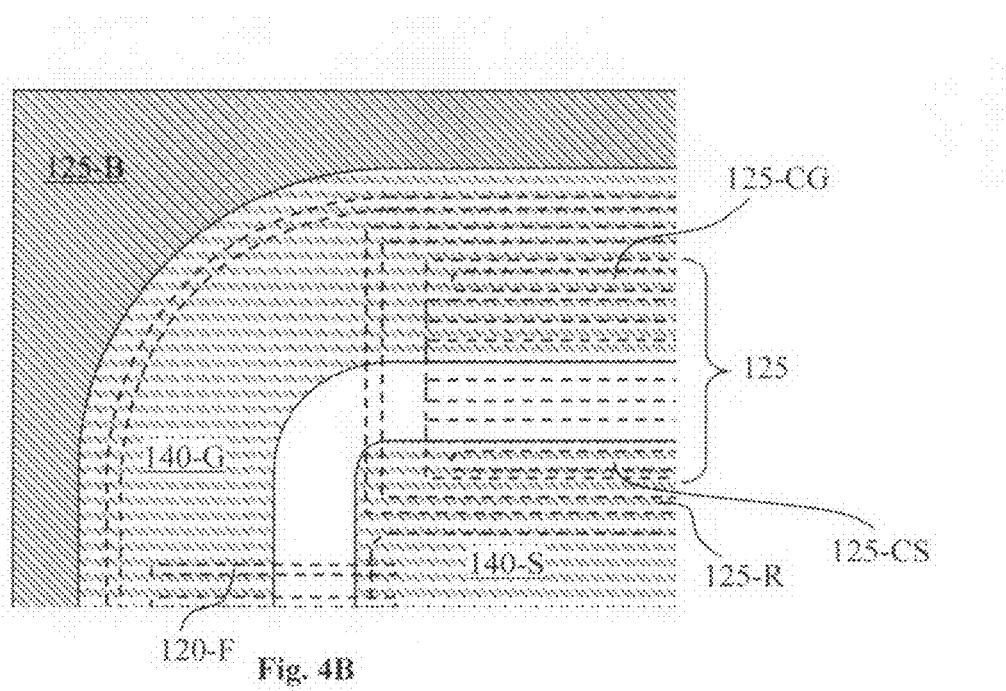
Figure 4C:
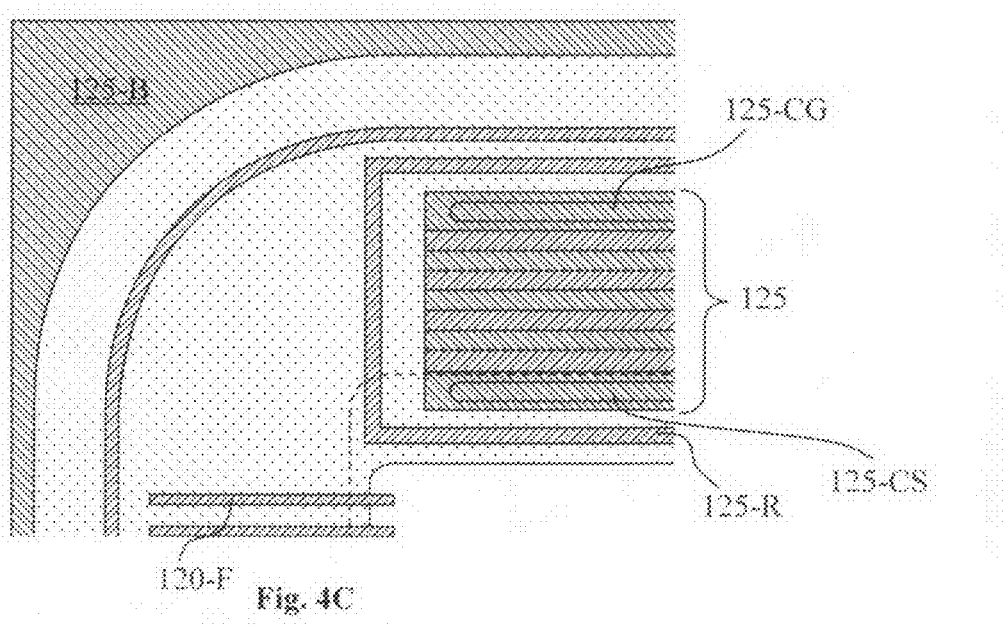

Referring to FIGS. 4A to 4C for three top views that include an overall top view shown in FIG. 4A and two explosive top views FIGS. 4B and 4C for the corners to show the layout of the device. As shown in FIG. 4A, the gate metal is formed around the device with gate trench fingers 120-F extended from the trenched gate in the active cell area to the termination area. On the left upper corner, the ESD protection circuit 125 is connected to the gate metal 140-G through the ESD-gate contact 125-CG and connected to the source metal 140-S through the ESD-source contact 125-CS. The ESD body block 125-B is extended to the edge of the device. A polysilicon ring 125-R is formed surrounding the ESD 125 to improve the breakdown voltage. FIG. 4C is same as FIG. 4B with the metal 140 removed to show the layer structure underneath.

Figure 5A:
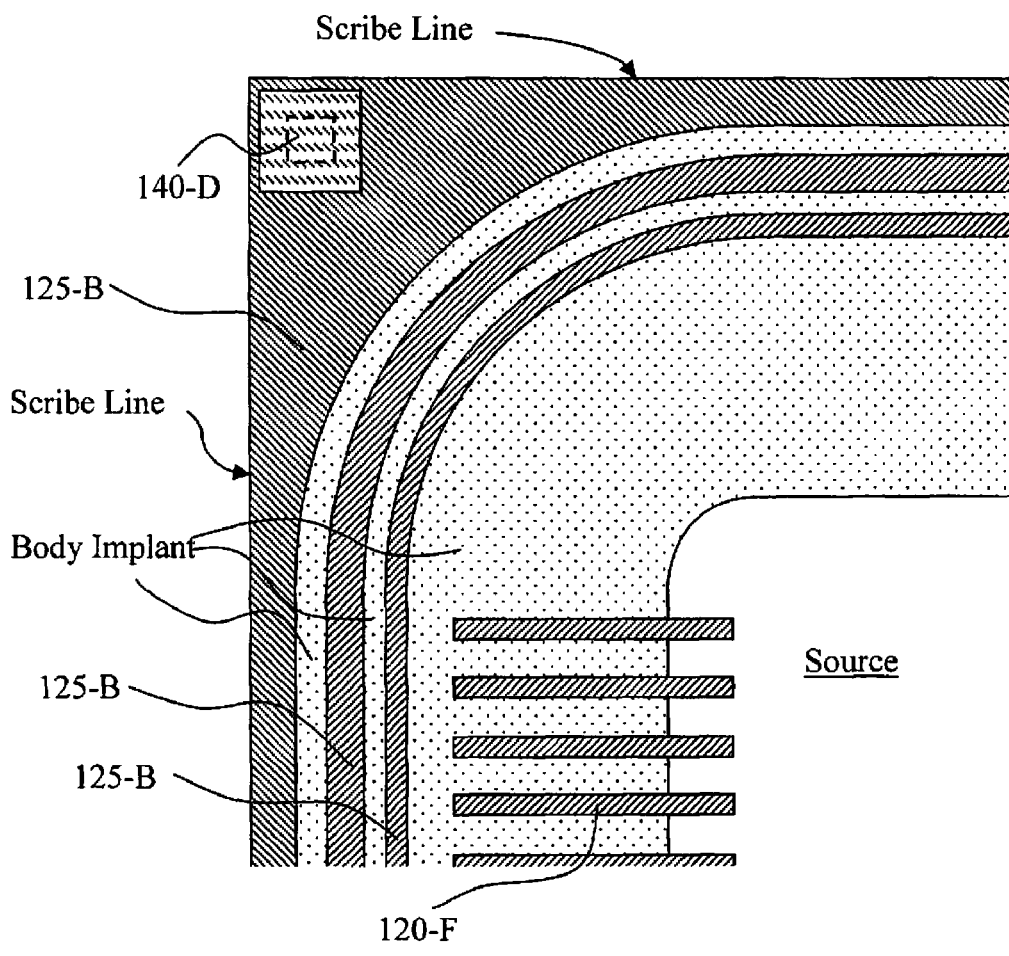
FIGS. 5A to 5C are three top views for showing three alternate embodiments of a MOSFET device protected by an ESD protection circuit manufactured with further reduced number of masks while providing higher range of operational voltages.
Figure 5B:
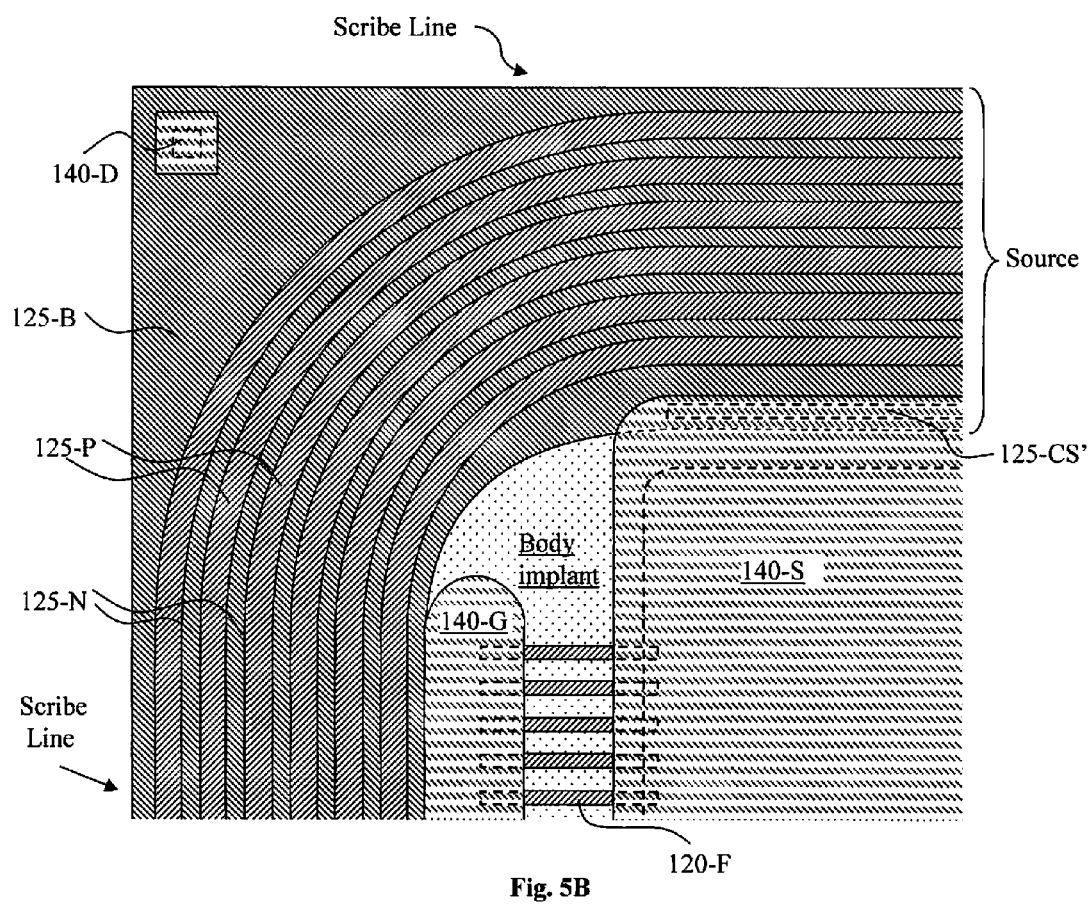
Figure 5C:
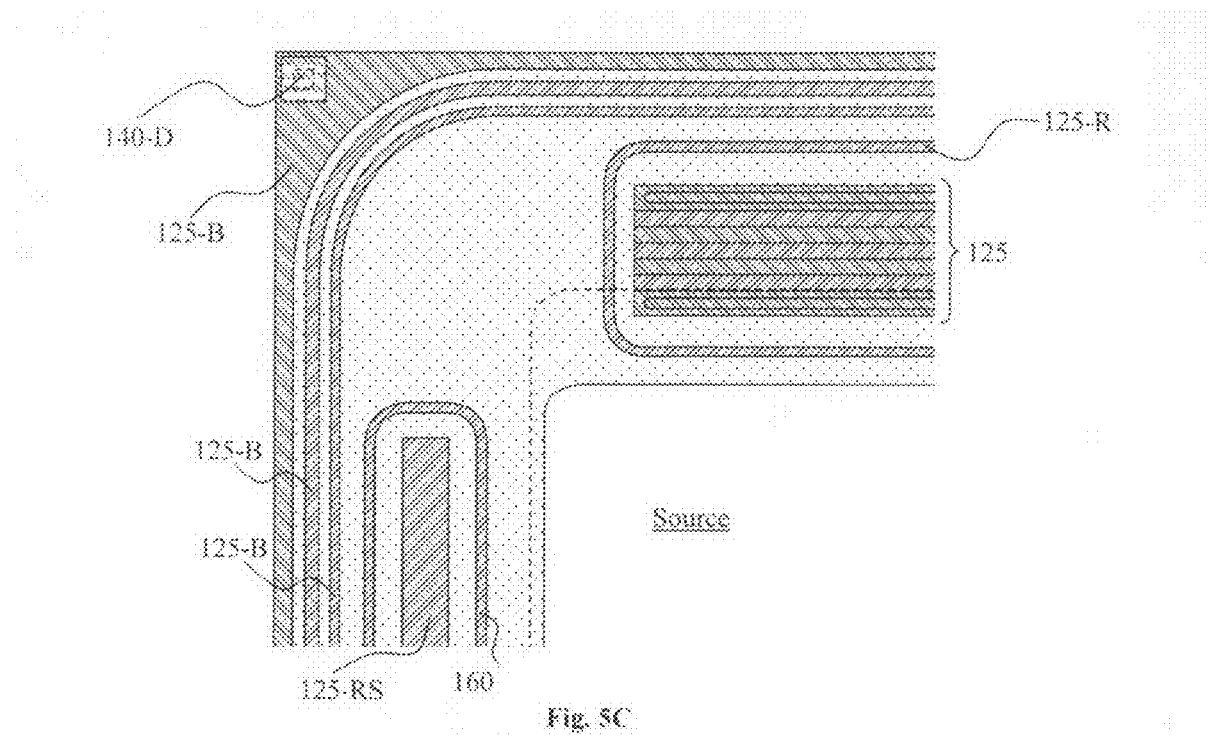

Referring to FIGS. 5A to 5C for three alternate embodiments of this invention. In FIG. 5A, the left upper corner of the MOSFET device 100 has a similar layout as FIGS. 3 to 4 with the ESD polysilicon layer 125-B extended to function as body implant mask such that the body mask is no longer necessary in the manufacturing process as described below. The gate metal 140-G disposed on the termination area on the peripheral surrounds the device and the source metal 140-S covers through the active cell area are not shown. A plurality of guard rings 138 are further formed between polysilicon segments 125-B. In the above embodiments shown in FIGS. 3 to 4, since the polysilicon segments 125-B applied for blocking the body implant are configured as floating regions, there is limitation of the device cannot be operated above a certain voltage. In order to resolve such limitation, the ESD polysilicon layer 125-B implemented as body implant block layer is formed to cover the edge of the device. Furthermore, a metal contact 140D is formed on the corner to connect the body implant blocking layer 125-B to the drain such that the body-implant blocking layer 125-B is no longer operated in a floating state thus enable the device to operate in a voltage range higher than the voltage as limited for the device disclosed above in FIGS. 3 to 4. The guard ring 125-R surrounds the ESD 125 to protect the ESD protection circuit 125 to prevent low breakdown. Furthermore, with the edge and the scribe lines of the device covered by the body-implant blocking layer 125 as that specifically shown in FIGS. 5A and 5B, a passivation layer is no longer necessary and that further reduces the required number of mask to five masks compared to the conventional seven masks requirement. Significant cost savings and product yield are achieved. FIG. 5B is similar embodiment as that shown in FIG. 5A. The different structure and features of this embodiment is the body block polysilicon is patterned and doped to form a plurality of body doped polysilicon stripes 125-P and source doped polysilicon stripes 125-N to form a plurality of back to back polysilicon diodes in series to function as the edge termination protection to improve the edge breakdown. One end of the series back to back polysilicon diodes is connected to drain through contact 140-D while the other end is connected to source metal 140-S through contact 125-CS'. FIG. 5C shows another similar embodiment of this invention. The differences of the structure and function features is to provide an ESD resistor 125-RS for the ESD protection circuit 125 and the ESD resistor 125-RS is protected by guard ring 160 to improve the breakdown voltage.

Figure 6A:
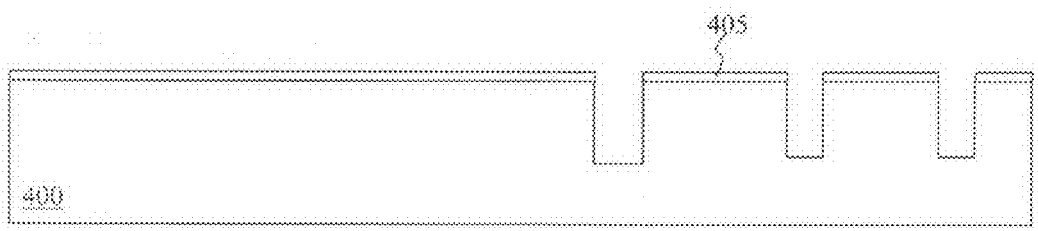
FIGS. 6A to 6J are a serial of side cross sectional views of a MOSFET device for showing the manufacturing processes for forming the ESD protection circuits with reduced number of masks.
Figure 6B:
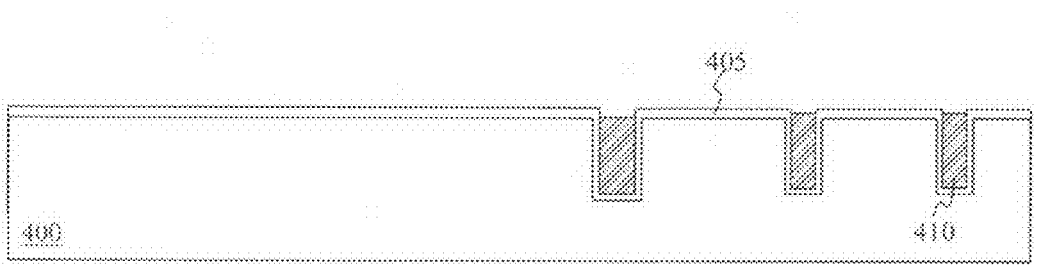
Figure 6C:
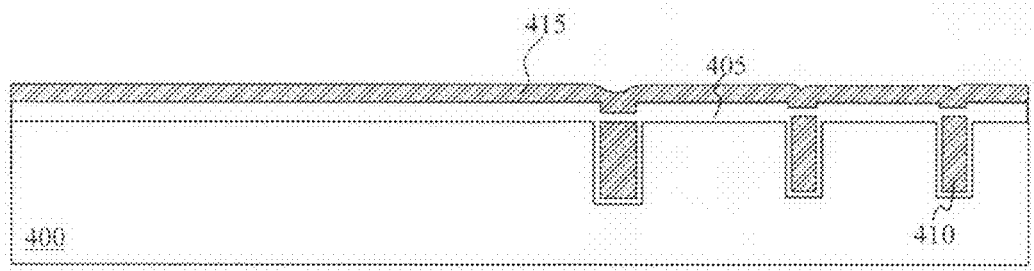
Figure 6D:
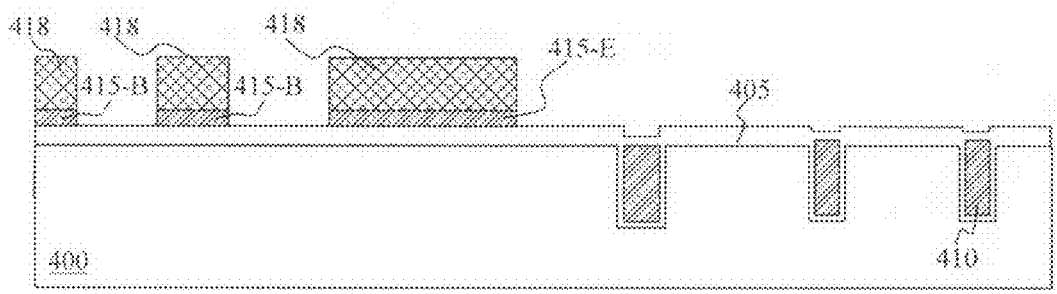
Figure 6E:
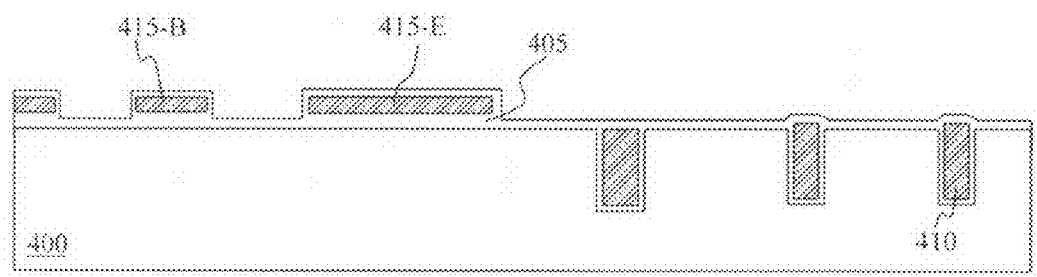
Figure 6F:
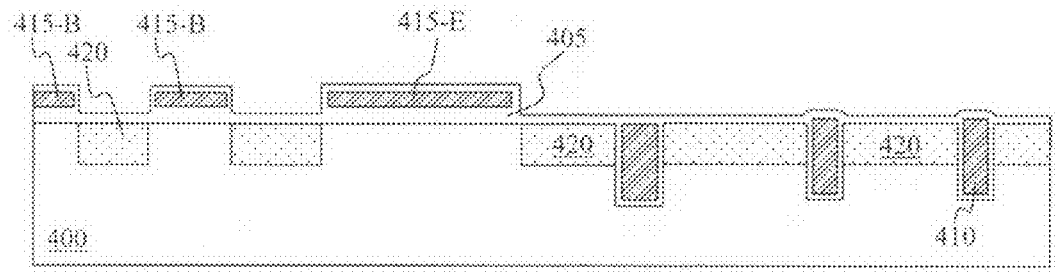
Figure 6G:
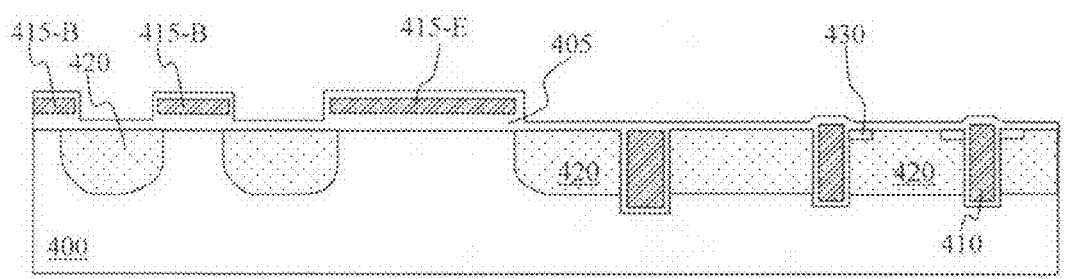
Figure 6H:
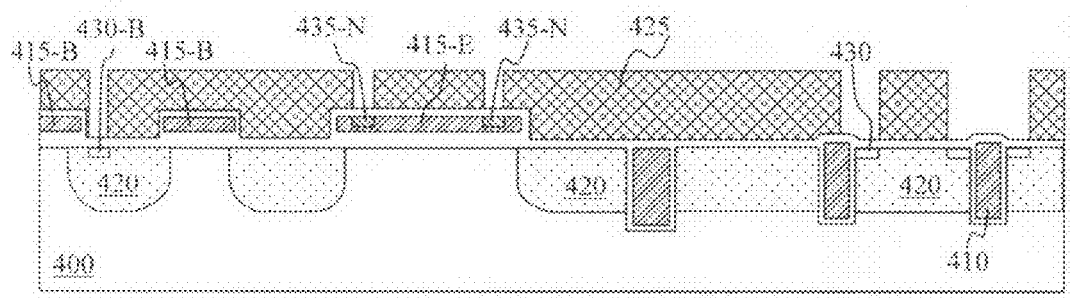
Figure 6I:
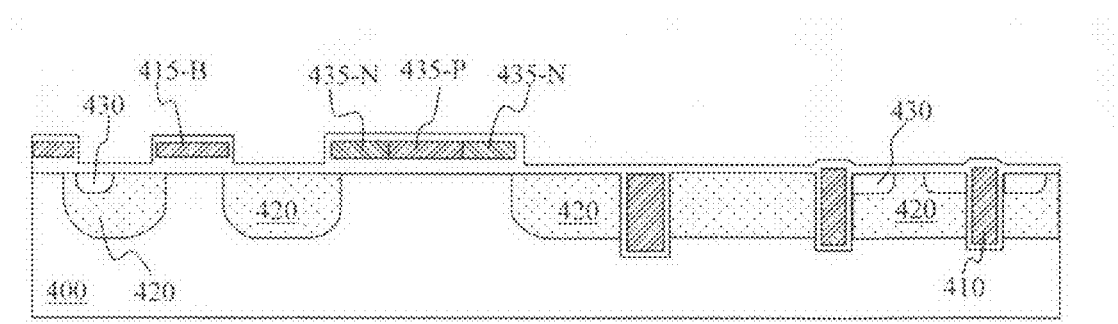
Figure 6J:
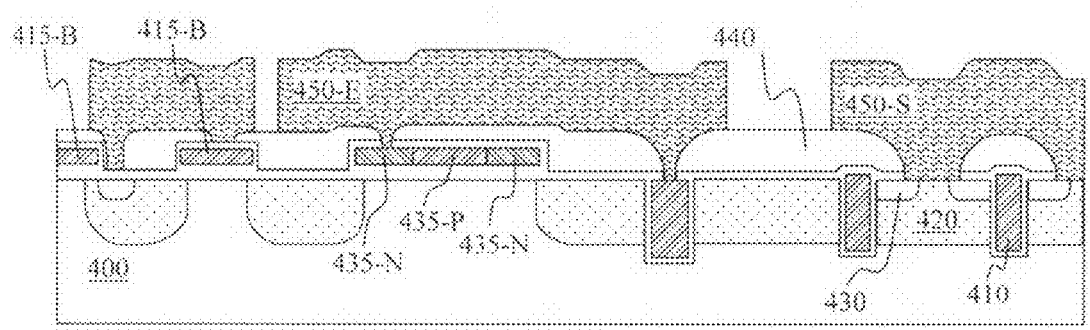

Referring to FIGS. 6A to 6J for a series of side cross sectional views for illustrating the manufacturing process of the MOSFET device with peripheral ESD protection circuits. The process starts with a semiconductor substrate, e.g., a silicon epitaxial layer 400 over substrate with oxide layer 405 situated on top of it. A trench photoresist mask (not shown) is applied to etch and open a plurality of trenches 410. Then the photoresist mask (not shown) is removed. In FIG. 6B, the trenches 410 are filled with polysilicon deposition followed by a blanket polysilicon etch back to remove the polysilicon layer from above the trenches 410. In FIG. 6C, the thickness of the oxide layer 405 is increased by a further oxidation process followed by depositing a ESD polysilicon layer 415 on top of the oxide layer 405. In FIG. 6D, an ESD mask 418 is applied to etch the polysilicon layer 415 into an ESD segment 415-E and a body-implant block segment 415-B. In FIG. 6E, the ESD mask 418 is removed and an oxide etch is carried out to remove the oxide layer 405 between the ESD polysilicon segment 415-E and the body implant block segment 415-B and the reminder portions of the top surface of the substrate 400. Then an annealing process is carried out. In FIG. 6F, a blanket body implant is carried out to implant the body regions 420. Unlike the conventional processing method, a body mask is not required. Polysilicon segments 415-B and 415-E block the ions from doping the substrate regions underneath and the polysilicon segments on top of substrate is now doped with body type dopant, in this case P type dopant. In FIG. 6G, a body diffusion process is carried out to diffuse and expand the body regions 420 into a greater depth into the substrate 400. In FIG. 6H, a source-ESD mask 425 is applied to implant source ions into the source regions 430 and N-doped regions 435-N on the ESD segment 415-E. As source implant usually uses a lot higher dosage than the body implant, regions 435-N is counter doped with N-type dopant to form the ESD protection diode with the P-type sections 435-P on the ESD polysilicon segment 415-E. The polysilicon segment 415-B may be patterned at the same time to form the alternative P and N regions as described in embodiment FIG. 5B. Source implant region 430-B is carried out as close to an edge of 415-B region as possible to minimize the PN junction for establishing connection to the drain region. In FIG. 6I, the source-ESD mask 425 is removed followed by a diffusion process to diffuse the source regions 430. In FIG. 6J, an insulation layer 440 composed of LTO/BPSG layer is deposited followed by applying a contact mask (not shown) to etch a plurality of contact openings. A contact implant is performed to form the contact doping region underneath each contact opening to reduce a contact resistance to the metal layer 450 formed on top of the insulation layer 440 for contacting the source/body and the gate through the contact openings. Connection of body block polysilicon segment 415-B to the drain may be formed at the same time. The processes are completed by applying a metal mask to pattern the metal layer 450 into source/body contact metal 450-S, ESD contact metal 450-E, and gate pads (not shown).

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for manufacturing a semiconductor power device on a semiconductor substrate comprising:
    depositing an electrostatic discharge (ESD) polysilicon layer on top of said semiconductor substrate and patterning said ESD polysilicon layer into a first portion as a body block segment and a second portion as an ESD segment; and
    implanting a body dopant through openings between the body block segment to form guard rings near a peripheral region of the semiconductor substrate and to form the body regions next to the ESD segment followed by doping the ESD segment with alternating P-type and N-type regions to function as diodes constituting an ESD protection circuit for the semiconductor power device.

2. The method of claim 1 wherein:
    said step of depositing said electrostatic discharge (ESD) polysilicon layer on top of said semiconductor substrate further comprising depositing said ESD polysilicon layer extending outwardly for covering a scribe line on an edge of said semiconductor device.

3. The method of claim 1 further comprising:
    forming a metal contact on a corner of said semiconductor device for electrically connecting said body block segment to a dope region of said semiconductor substrate whereby said body block segment is operated in a non-floating voltage in said semiconductor power device.

4. The method of claim 1 wherein:
    said step of patterning said ESD polysilicon layer into said ESD segment further comprising patterning said ESD segment adjacent to a termination area opposite an active area of said semiconductor power device.

5. The method of claim 1 further comprising:
    applying a source mask covering a portion of said said ESD segment and also covering over said body block segment for doping said ESD segment into the ESD diodes formed with alternating P-type and N-type polysilicon sections in said ESD segment.

6. The method of claim 1 wherein:
    said step of forming said ESD protection circuit for said semiconductor power device further comprising a step of forming said ESD protection circuit for a MOSFET device with said ESD segment with the alternating P-type and N-type polysilicon sections electrically connected to a source and a gate of said MOSFET device.

7. The method of claim 1 further comprising:
    forming said MSFET device as an N-channel MOSFET and implanting a p-type dopant to form the guard ring near a peripheral region of for said semiconductor substrate.

8. The method of claim 1 wherein:
    said step of forming said ESD protection circuit further comprising a step of forming a segment of the ESD polysilicon layer as a resistor segment for electrically connecting to said ESD segment.

9. The method of claim 1 further comprising:
    applying a trench mask for opening a plurality of trenches before said step of depositing and patterning said electrostatic discharge (ESD) polysilicon layer into said body block segment and ESD segment on top of said semiconductor substrate;
    after said step of implanting the body dopant over the ESD segment and the body block segment, applying a source mask for covering a portion of said ESD segment and said body block segment for doping said ESD segment into ESD diodes formed with alternating P-type and N-type polysilicon sections in said ESD segment and implanting a plurality of source regions in said body regions; and
    applying a contact mask, a metal mask and a passivation mask for manufacturing said semiconductor power device for manufacturing the semiconductor power device by applying six masks.

10. The method of claim 1 further comprising:
    applying a trench mask for opening a plurality of trenches before said step of depositing and patterning said electrostatic discharge (ESD) polysilicon layer into said body block segment and ESD segment on top of said semiconductor substrate;
    said step of depositing and patterning said ESD polysilicon layer further comprising depositing and patterning said ESD polysilicon layer for covering scribe lines on edges of said semiconductor power device; and after said step of implanting the body dopant over the ESD segment and the body block segment, applying a source mask; a contact mask, and a metal mask for manufacturing said semiconductor power device for manufacturing the semiconductor power device by applying five masks.

* * * * *